United States Patent [19]

Ellis

[11] 3,736,516

[45] May 29, 1973

[54] VARIABLE FREQUENCY PULSE GENERATING CIRCUIT

[75] Inventor: Charles W. Ellis, Lorain, Ohio

[73] Assignee: Lorain Products Corporation, Lorain, Ohio

[22] Filed: June 14, 1971

[21] Appl. No.: 152,642

[52] U.S. Cl. ..................328/134, 328/155, 307/233, 328/133

[51] Int. Cl. ..................H03k 5/20

[58] Field of Search ..................328/134, 141, 155; 307/232, 233

[56] References Cited

UNITED STATES PATENTS

| | | | |
|---|---|---|---|
| 3,671,776 | 6/1972 | Houston | 328/133 |
| 3,610,954 | 10/1971 | Treadway | 307/233 X |
| 3,012,200 | 12/1961 | Hurvitz | 328/134 |
| 3,430,148 | 2/1969 | Miki | 328/155 X |
| 3,515,997 | 6/1970 | Babany | 328/134 |
| 3,633,115 | 1/1972 | Epstein | 328/155 X |

*Primary Examiner*—John S. Heyman
*Attorney*—John Howard Smith

[57] ABSTRACT

A circuit for providing an output pulse train which has a variable frequency when the circuit operates in a first mode and for providing an output pulse train which has a fixed, precise frequency when the circuit operates in a second mode. A fixed frequency pulse generator applies a pulse train having a fixed frequency to one input of a pulse frequency modifying circuit. A variable frequency pulse generator applies a pulse train having a variable frequency to another input of the pulse frequency modifying circuit. When the latter circuit operates in its first mode, the state of the voltage at the circuit output is controlled in accordance with both the fixed and variable frequency input pulse trains and the output pulse train reflects the algebraic sum thereof. When, however, the circuit operates in its second mode, the effect of the variable frequency input pulse train is suppressed and the output frequency is controlled solely in accordance with the frequency of the fixed frequency pulse generator.

5 Claims, 7 Drawing Figures

INVENTOR.
CHARLES W. ELLIS

BY [signature]

ATTORNEY

INVENTOR.
CHARLES W. ELLIS

BY John H. Smith
ATTORNEY

INVENTOR:
CHARLES W. ELLIS
BY John Howard Smith
ATTORNEY

INVENTOR:
CHARLES W. ELLIS
BY
ATTORNEY

VARIABLE FREQUENCY PULSE GENERATING CIRCUIT

BACKGROUND OF THE INVENTION

The present invention relates to pulse generating circuits and is directed more particularly to a pulse generating circuit which produces an output pulse train having a variable output frequency when the circuit operates in a first mode and having a fixed, precise output frequency when the circuit operates in a second mode.

Under circumstances where digital switching networks such as flip-flops and gates are utilized to control circuitry which operates in the presence of a-c voltages and currents, it is often necessary to adjust the operative frequency of some portions of the switching circuitry to match that of, for example, the a-c line. In an inverter which must supply uninterrupted a-c power to a load in the event of a-c source, for example, line failure or excessive a-c line frequency variations, it is necessary to provide control circuitry which can cause the inverter to operate in synchronism with the a-c line when the latter provides voltage of a satisfactory amplitude and frequency and which can cause the inverter to operate independently of the a-c line when the a-c line fails. Similar control circuitry is necessary where the output of an inverter is to be connected in parallel with the a-c line. One such control circuit is described in the copending U.S. patent application of C. Ellis, Ser. No. 152,770, entitled Phase Responsive Control Circuit.

In the past, it has been the practice to vary the frequency of a pulse train by controlling the voltage applied to a controllable oscillator such as, for example, an oscillator of the well-known unijunction type. These controllable oscillators are subject to two serious difficulties. First, the range over which the frequency of such oscillators can be accurately varied is relatively narrow. A second difficulty is that the frequencies of the pulse trains produced by such oscillators are unstable in that they tend to drift from the desired values with time and temperature.

In considering the present invention it will be found that the circuitry may be applied to an extremely wide range of fixed frequencies from, for example, the lower frequencies of a-c commercial line to extremely high frequencies in the megacycle range, limited only by the state of the art relative to the rapidity of switching capability of associated switching devices and further, that fixed frequency being once established, may itself be increased or decreased over a relatively wider range than heretofore possible.

SUMMARY OF THE INVENTION

Accordingly, it is an object of the invention to provide a pulse generating circuit, the output of which may be varied over a relatively wide range of frequencies with respect to a preselected fixed frequency.

Another object of the invention is to provide a pulse generating circuit which operates over a wide range of preselected fixed frequencies.

Yet another object of the invention is to provide a variable frequency pulse generating circuit having an output frequency which is relatively stable with time and temperature.

It is another object of the invention to provide circuitry including a fixed frequency pulse generator for establishing a pulse train having a fixed, precise frequency, a variable frequency pulse generator for establishing one or more pulse trains having a variable frequency and a pulse frequency modifying circuit for changing the number of transitions in the pulse train established by the fixed frequency pulse generator in accordance with pulses from the variable frequency pulse generator.

Still another object of the invention is to provide circuitry which can either increase or decrease the number of transitions in the pulse train established by the fixed frequency pulse generator.

A further object of the invention is to provide circuitry of the above character wherein the switching activity of the frequency modifying circuit occurs at predetermined times during the pulse generating activity of the fixed frequency pulse generator.

It is another object of the invention to provide a pulse generator circuit which has a variable output frequency when the circuitry operates in a first mode and which has a fixed, precise output frequency when the circuitry operates in a second mode.

Still another object of the invention is to provide a dual-mode variable frequency pulse generating circuit wherein the operative mode may be selected by means of an externally generated control voltage.

DESCRIPTION OF THE INVENTION

The present circuitry is characterized by operation in one or the other of two modes. In the first mode a predetermined, desired frequency may be established by adjusting the circuit in a manner to obtain that desired frequency, this adjustment being accomplished by utilizing the features of the invention. In this sense the output frequency is variable according to the adjustment activity and it is with this meaning that the term "variable" is used herein. In the second mode of operation a fixed frequency proportional to the frequency of a pulse generator is fed to the load as a stable, predetermined, fixed frequency, this being accomplished by a suppression activity made possible by the circuitry of the invention.

Figure 1:
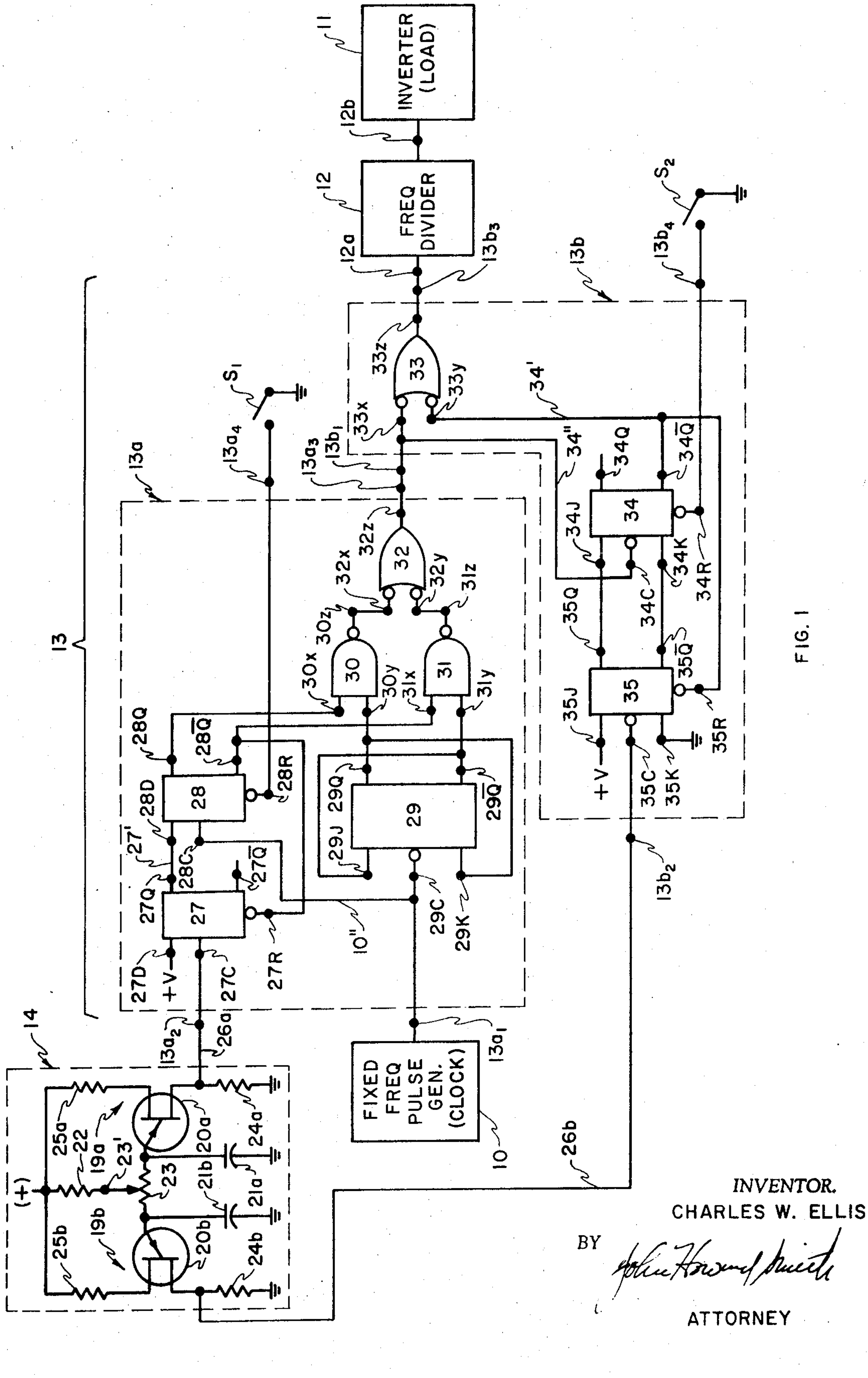
FIG. 1 is a combined schematic and logic diagram showing one circuit embodying the invention, FIGS. *2a–d* are timing diagrams showing the states of the inputs and outputs of selected networks of FIG. 1.

Referring to FIG. 1, there is shown a fixed frequency pulse generator 10 such as, for example, a crystal oscillator for supplying switching pulses to an inverter or other suitable load 11. In the present embodiment, these pulses are applied to load 11 through a pulse frequency divider circuit 12. The latter circuit serves to establish a pulse train at the output **12*b* thereof which has a frequency that is lower than but directly proportional to the frequency of the pulse train appearing at the input 12a thereof. Frequency divider 12** may include any one of the many well-known types of counter circuits such as those including chains of flip-flops or ring-counters.

To the end that the frequency of the pulses applied to load 11 may be increased or decreased from the fixed value which would exist if counter circuit 12 were energized directly from fixed frequency pulse generator 10, there is provided a pulse frequency modifying circuit 13 and a variable frequency pulse generator 14. In the present embodiment, frequency modifying circuit 13 includes a pulse adder circuit 13*a* having a fixed frequency input $13a_1$, a variable frequency input $13a_2$ and an output $13a_3$. Frequency modifying circuit 13 also includes a pulse subtractor circuit 13*b* having a fixed frequency input $13b_1$, a variable frequency input $13b_2$ and an output $13b_3$.

Each time that generator 14 applies a frequency control pulse to the variable frequency input $13a_2$ of pulse adder circuit 13*a*, the number of pulses which appear at the output $13a_3$ thereof is increased by one. Similarly, each time that generator 14 applies a frequency control pulse to the variable frequency input $13b_2$ of pulse subtractor circuit 13*b*, the number of pulses appearing at the output $13b_3$ thereof is decreased by one. It will, therefore, be seen that the frequency of the pulses applied to frequency divider 12 and load 11 is determined by the number of frequency control pulses which generator 14 applies to the inputs of frequency modifying circuit 13.

The exemplary circuit of the present embodiment utilizes TTL logic wherein the high state is represented by a voltage which is greater than 2.7 volts positive from ground and wherein the low state is represented by a voltage which is less than 0.4 volts positive from ground. Thus, when a given point is said to be high, it is meant that the voltage at that point is more than 2.7 volts positive from ground, and when a given point is said to be low, it is meant that the voltage at that point is less than 0.4 volts positive from ground.

An example of a first type of logic device is the gate 30 of FIG. 1. Gate 30 has first and second inputs 30*x* and 30*y* and an output 30*z*. The output of this gate is low only if input 30*x* and input 30*y* thereof are high. A second type of logic device is the gate 32 of FIG. 1. The output of the latter gate is high only so long as input 32*x* or input 32*y* or both are low.

Another type of logic device is the J–K flip-flop 34 of FIG. 1. Flip-flop 34 has synchronous inputs 34J and 34K, a synchronous clock input 34C, an asynchronous reset input 34R and first and second outputs 34Q and 34$\overline{Q}$ which are normally in opposite logical states. A low appearing at input 34R will cause output 34$\overline{Q}$ to go high thus resetting the flip-flop. The flip-flop will remain in this condition so long as input 34R remains low. When input 34R is high, flip-flop output 34Q will not go high (the flip-flop will not be set) until input 34J is high at the time when a high-to-low transition occurs in the votage at input 34C. Similarly, output 34$\overline{Q}$ will not go high (the flip-flop will not be reset) until input 34K is high at the time when a high-to-low transition appears in the voltage at clock input 34C.

Still another type of logic device is the D or delay type flip-flop 27 of FIG. 1. Flip-flop 27 has a signal input 27D, a clock input 27C, an unclocked input 27R and first and second complementary outputs 27Q and 27$\overline{Q}$. A low appearing at input 27R will cause output 27$\overline{Q}$ to go high thus resetting the flip-flop. The flip-flop will remain in its reset state so long as input 27R remains low. When input 27R is high, output 27Q will assume the same state as input 27D when there occurs a low-to-high transition in the voltage at clock input 27C. Thus, the occurrence of a clock pulse conforms the state of the 27Q output to the state of the 27D input.

To the end that variable frequency pulse generator 14 may furnish frequency modifying pulses to pulse adder 13*a* as well as to pulse subtractor 13*b*, generator 14 includes oscillator circuits 19*a* and 19*b*. In the present embodiment, these oscillators include unijunction transistors 20*a* and 20*b*, timing capacitors 21*a* and 21*b*, a frequency control network including fixed resistor 22 and potentiometer 23, lower base resistors 24*a* and 24*b* and upper base resistors 25*a* and 25*b*.

Unijunction transistor 20*a* will fire when capacitor 21*a* charges to a voltage equal to a predetermined fraction of the voltage between the upper and lower bases thereof. When this occurs, capacitor 21*a* will discharge through transistor 20*a* and resistor 24*a* to establish a positive output voltage pulse between ground and conductor 26*a*. The time at which this output will occur is determined by the resistance through which capacitor 21*a* must charge. In the present instance this resistance includes resistor 22 and the resistance of that section of potentiometer 23 which lies between the right end thereof (as shown in FIG. 1) and wiper arm 23'. Similarly, the time at which oscillator 19*b* will produce a positive output voltage pulse between ground and conductor 26*b* is determined by resistor 22 and the resistance of that section of potentiometer 23 which lies between the left end thereof and wiper arm 23'.

Because the resistances in series with capacitors 21*a* and 21*b* are both changed by the movement of wiper arm 23', the movement of the latter in either direction increases the operative frequency of one oscillator at the same time that it decreases the operative frequency of the other oscillator. This differential configuration assures that the sum of the pulses produced by oscillators 19*a* and 19*b* within a given period of time is approximately constant. This constancy causes any output frequency error or uncertainty resulting from the presence of generator 14 to be substantially constant over the entire range of variation of potentiometer 23.

To the end that the number of pulses which generator 10 causes to appear at the output $13a_3$ of pulse adder 13*a* may be increased by one each time a frequency control pulse is applied to the variable frequency input $13a_2$ thereof, pulse adder 13*a* includes a pulse phase control network including flip-flops 27, 28 and 29 and a mixing or comparing network including gates 30, 31 and 32. The pulse phase network includes two switching networks which, taken together, assure that each added pulse occurs at a time when the proper conditions for pulse addition exist. The first switching network includes a flip-flop 29 for controlling the states of inputs 30*y* and 31*y* of the mixing network in accordance with clock pulses from generator 10. The second switching network includes flip-flops 27 and 28 for controlling the states of inputs 30*x* and 31*x* of the mixing network in accordance with frequency control pulses from oscillator 19*a* as well as in accordance with clock pulses from generator 10. The mixing network, in turn, controls the output of the pulse adder both in accordance with the output of the first switching network, as manifested by the state of flip-flop 29, and in accordance with the output of the second switching network, as manifested by the state of flip-flop 28. This assures that the output frequency of the pulse adder reflects the pulse generating activity of both the variable and the fixed frequency pulse generators.

Figure 2A:
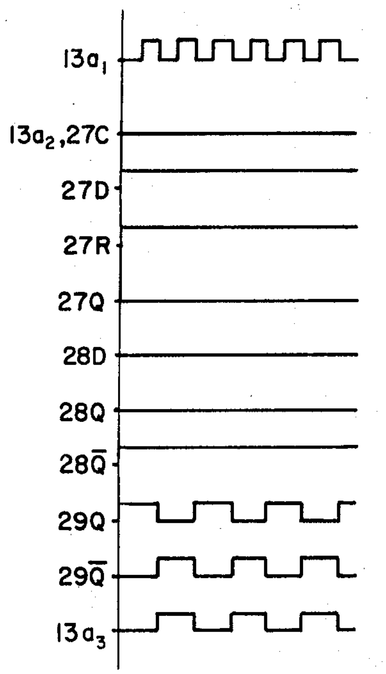

When oscillator 19*a* does not apply frequency control pulses to input $13a_2$ of pulse adder 13*a*, the latter cannot increase the number of pulses at output $13a_3$ thereof above the number of pulses which are initiated by clock pulses appearing at fixed frequency input $13a_1$ thereof. This is because, under the above condition, flip-flop 28 remains in its reset state while the state of flip-flop 29 reverses each time there occurs a high-to-low transition in the clock signal produced by generator 10. The above conditions are illustrated in FIG. 2*a* which shows the voltages with respect to ground of various points in the circuit, all quantities being plotted as a function of time. Gates 30, 31 and 32, operating together, compare the state of flip-flop 28 with the state of flip-flop 29. If flip-flops 28 and 29 are in the same state, there is, if both flip-flops are set or if both flip-flops are reset, the output 32*z* of gate 32 will be high. If flip-flops 28 and 29 are in opposite states, the output of gate 32 will be low. It will, therefore, be seen that, under the assumed conditions, the output of gate 32 will go high each time flip-flop 29 is reset by generator 10 and will go low each time flip-flop 29 is set by generator 10. Thus, in the absence of frequency control pulses from oscillator 19*a*, the state of the output of pulse adder 13*a* is controlled by fixed frequency pulse generator 10.

When oscillator 19*a* does apply frequency control pulses to input $13a_2$, pulse adder 13*a* can increase the number of pulses at output $13a_3$ thereof above the number of pulses which are initiated by clock pulses appearing at fixed frequency input $13a_1$ thereof. As is most clearly seen in FIG. 2*b*, the appearance of frequency control pulse $P_A$ at variable frequency input $13a_2$ of pulse adder 13*a* sets flip-flop 27 and thereby applies a high to or, in other words, loads the input of flip-flop 28. The latter flip-flop delays the effect of frequency control pulse $P_A$ upon mixing gates 30, 31 and 32 until a time, in the pulse generating activity of generator 10, which is suitable for pulse addition. At the end of this period of delayed activity, when the clock signal from generator 10 undergoes a low-to-high transition ($T_1$ of FIG. 2*b*), flip-flop 28 is set via conductor 27′ to initiate the desired pulse addition.

Figure 2B:
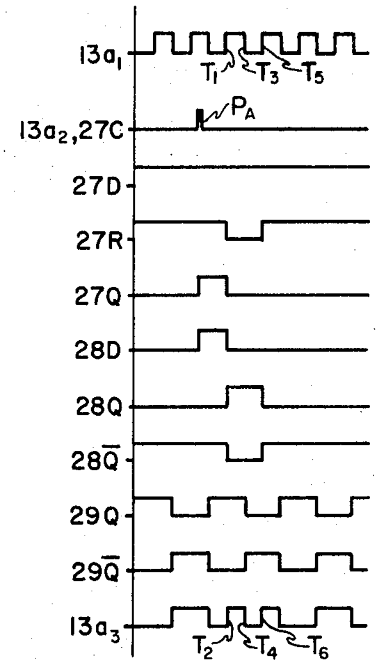

Assuming that flip-flop 28 is set prior to the occurrence of transition $T_1$, as shown in FIG. 2*b*, flip-flop outputs 28Q and 29Q will be in opposite states prior to transition $T_1$, but will be in the same state after that transition. Because this change from unlike to like states causes gate 32 to change the state of the output of pulse adder 13*a*, as previously described, a transition $T_2$ appears at the output $13a_3$ of pulse adder 13*a* as a result of the occurrence of low-to-high transition $T_1$. Since output transition $T_2$ of FIG. 2*b* is initiated by a low-to-high transition in the clock signal while all other output transitions in FIGS. 2*a* and 2*b* are initiated by high-to-low transitions of the clock signal, it will be seen that transition $T_2$ of FIG. 2*b* is an additional transition which occurs as a result of the occurrence of frequency control pulse $P_A$.

If flip-flop 29 is in its reset state prior to the occurrence of transition $T_1$, flip-flops 28 and 29 will be in the same state prior to the occurrence of transition $T_1$ but in opposite states after that transition. As a result, the mixing circuit will still cause an additional transition to appear at the output of pulse adder 13*a*. Thus, an extra output transition will occur, upon the occurrence of the first low-to-high clock transition which follows frequency control pulse $P_A$, regardless of the then existing state of flip-flop 29.

After transitions $T_1$ and $T_2$ of FIG. 2*b*, flip-flop outputs 28Q and 29Q are in the same (high) state. Thereafter, when high-to-low transition $T_3$ of the clock signal resets flip-flop 29, flip-flop outputs 28Q and 29Q will once again assume opposite states and thereby initiate a high-to-low transition $T_4$ at the output of pulse adder 13*a*. Still later, when low-to-high transition $T_5$ of the clock signal occurs, flip-flop 28 resets. Since flip-flop 29 is already reset when this occurs, low-to-high transition $T_6$ appears at the output of pulse adder 13*a*. The latter transition, like transition $T_2$, has no counterpart in FIG. 2*a*. It is an additional transition introduced as a result of the occurrence of frequency control pulse $P_A$. After the occurrence of transition $T_6$, all the logic devices of pulse adder 13*a* will be in the same states which they would have been in if no $P_A$ pulse had occurred. As a result, the pulse adder will operate in the manner described with reference to FIG. 2*a* until the next $P_A$ pulse occurs, at which time the above described process will repeat.

From the foregoing, it will be seen that the application of a $P_A$ pulse to flip-flop 27 allows flip-flop 28 to change from its normally reset state upon the next occurring low-to-high transition of the clock signal and to return to its reset state upon the following low-to-high transition of the clock signal. Each of these transitions gives rise to an extra transition in the state of the output of the pulse adder. Together, these extra transitions comprise an added pulse. Thus, the number of pulses appearing at the output of pulse adder 13*a* is increased by one each time oscillator 19*a* applies a frequency control pulse to variable frequency input $13a_2$ of pulse adder 13*a*.

As described previously, it is an important feature of the invention that the added transitions occur at predetermined times during the pulse generating activity of generator 10. In the present embodiment, this is accomplished by utilizing a flip-flop 29 which changes state on the negative going transitions of the clocl signal and by utilizing a flip-flop 28 which changes state on the positive going transitions of the clock signal. As a result, the transitions at the output of pulse adder 13*a* cannot be separated by less than one-half of the period of the clock signal. This prevents pulses from being "missed" due to crowding.

To the end that the number of pulses which generator 10 and pulse adder 13*a* apply to input $13b_1$ of pulse subtractor 13*b* may be decreased by one each time a frequency control pulse is applied to the variable frequency input $13b_2$ thereof, the pulse subtractor includes a pulse phase control network including pulse adder 13*a*, flip-flops 34 and 35 and a mixing network including a gate 33. The pulse phase control network includes two switching networks which, taken together, assure that the desired pulse subtracting activity occurs at times when suitable opportunities for pulse elimination exist. The first switching network includes pulse adder 13*a*. This network controls the state of input 33*x* of mixing gate 33 in accordance with clock pulses from generator 10 as modified by frequency control pulses from oscillator 19*a*, if any. The second switching network includes flip-flops 34 and 35. This network controls the state of input 33*y* of mixing gate 33 in accordance with frequency control pulses from oscillator 19*a* as well as in accordance with clock pulses from generator 10. The mixing network, in turn, controls output $13b_3$ of pulse subtractor 13*b* both in accordance with the output of the first switching network, as manifested by the state of gate 32, and in accordance with the output of the second switching network, as manifested by the state of flip-flop 34. This assures that the output frequency of the pulse subtractor reflects the pulse generating activity of both the variable and the fixed frequency pulse generators.

Figure 2C:
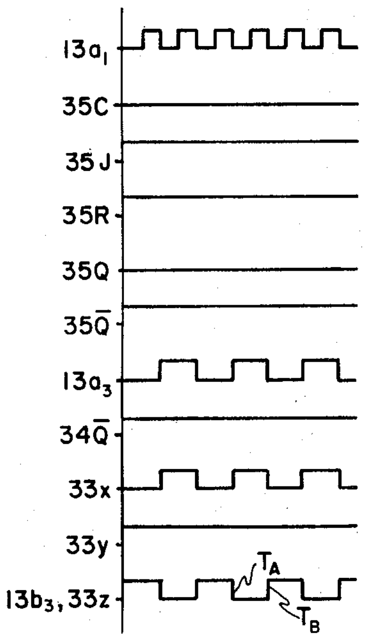

When oscillator 19*b* does not apply frequency control pulses to input 13*b*$_2$ of pulse subtractor 13*b*, the latter circuit cannot cause the number of pulses which appear at the output thereof to be less than the number of pulses which appear at the input thereof. This is because, under the above conditions, flip-flop 34 is continuously in its reset state. Since flip-flop output 34$\overline{Q}$ is continuously high and is connected to gate input 33*x* through a conductor 34', the state of gate output 33*z* and, therefore, the state of output 13*b*$_3$ of pulse subtractor 13*b* is determined solely by the state of gate input 33*x*. Since the state of the latter input is determined by the state of the output of pulse adder 13*a* which is, in turn, controlled by generator 10, pulse subtractor 13*b* cannot alter the frequency of the pulses established by generator 10 in the absence of frequency control pulses from oscillator 19*b*. This condition is illustrated in FIG. 2*c*.

When oscillator 19*b* does apply a frequency control pulse to input 13*b*$_2$ of pulse subtractor 13*b*, the latter circuit can cause the number of pulses which appear at the output whereof to be less than the number of pulses which appear at the input thereof. As is most clearly seen in FIG. 2*d*, the appearance of a $P_B$ frequency control pulse at variable frequency input 13*b*$_2$ of pulse subtractor 13*b* sets flip-flop 35 and thereby applies a high to (loads) flip-flop input 34J. The latter flip-flop delays the effect of frequency control pulse $P_B$ upon mixing gate 33 until a time, in the pulse generating activity of generator 10, which is suitable for pulse elimination. At the end of this period of delayed activity, when output 13*a*$_3$ of pulse adder 13*a* goes low, flip-flop 34 is set via conductor 34'' to initiate the desired pulse elimination.

When flip-flop 34 assumes its set state, output 34$\overline{Q}$ thereof goes low and thereby applies a low to gate input 33*y* through a conductor 34'. Since output 13*a*$_3$ of pulse adder 13*a* has already applied a low to gate input 33*x*, the setting of flip-flop 34 has no effect upon the state of gate output 33*z*. Later, when the output of the pulse adder goes high, the state of gate output 33*z* does not change. This is because gate input 33*y* is held low by flip-flop output 34$\overline{Q}$. As a result, there is no transition at pulse subtractor output 13*b*$_3$ of FIG. 2*d* which corresponds to the transition $T_A$ of FIG. 2*c*. Thus, as output transition is eliminated as a result of frequency control pulse $P_B$.

The above condition will continue until after pulse adder 13a undergoes another high-to-low transition. When that transition occurs, flip-flop 34 will return to its reset state to render high gate input 33*y*. This will not, however, change the state of gate output 33*z* because gate input 33*x* is held low as a result of the last occurring low-to-high transition at the output of the pulse adder. As a result, there is no transition at pulse subtractor output 13*b*$_3$ of FIG. 2*d* which corresponds to transition $T_B$ of FIG. 2*c*. Thus, a second output transition is eliminated as a result of the occurrence of frequency control pulse $P_B$. After the resetting of flip-flop 34, all the logic devices of pulse subtractor 13*b* will be in the same states which they would have been in if no $P_B$ pulse had occurred. As a result, pulse subtractor 13*b* will operate in the manner shown in FIG. 2*c* until the next $P_B$ pulse occurs, at which time the above described pulse elimination process will repeat.

From the foregoing, it will be seen that the application of a $P_B$ pulse to flip-flop 35 causes flip-flop 34 to change from its normally reset state upon the next occurring high-to-low transition at the output of the pulse adder and to return to its original state after the output of the pulse adder has undergone two more high-to-low transitions. Since flip-flop 34 prevents a change in the state of output 13*b*$_3$ of pulse subtractor 13*b* during the above two transitions, the total number of output pulses is decreased by one. This is because two output transitions comprise one output pulse. Thus, the number of pulses appearing at the output of the pulse subtractor is decreased by one each time oscillator 19*b* applies a frequency control pulse to the input 13*b*$_2$ of the pulse subtractor.

While the foregoing description has dealt with the operation of the pulse adder separately from the operation of the pulse subtractor, it will be understood that, in practice, both operate simultaneously and in opposition to one another. If, for example, wiper arm 23' is adjusted so that the number of frequency control pulses produced by oscillator 19*a* is equal to the number of frequency control pulses produced by oscillator 19*b*, the effect of the pulses which are added by adder 13*a* will be cancelled by the effect of the pulses which are subtracted by subtractor 13*b*. As a result, the number of pulses applied to frequency divider 12 will be controlled solely in accordance with the number of pulses produced by fixed frequency pulse generator 10. If, on the other hand, wiper arm 23' is moved to the right so that oscillator 19*a* produces more pulses then oscillator 19*b*, the frequency increasing effect of adder 13*a* will overshadow the frequency decreasing effect of subtractor 13*b* and the number of output pulses applied to frequency divider 12 will be greater than the number which would have been applied thereto by the action of generator 10 alone. The opposite effect will, of course, be produced if wiper arm 23' is moved to the left.

The only limitation on the amount by which the output frequency of the circuit of the invention can be increased is the requirement that after flip-flop 27 is set by one $P_A$ pulse, it must be reset by flip-flop 28 before the occurrence of another $P_A$ pulse. Similarly, the only limitation on the amount by which the output frequency of the circuit of the invention can be decreased is the requirement that after flip-flop 35 is set by one $P_B$ pulse, it must be reset by flip-flop 34 before the occurrence of another $P_B$ pulse. These limits provide a wide range within which frequency variation is possible, this range including variations of up to plus or minus 100 percent of the predetermined fixed output frequency about the predetermined fixed output frequency.

In addition, the circuit of the invention provides an output pulse train which is subject to smaller output frequency errors for a given variation of the output frequency from the predetermined fixed output frequency than previously available variable frequency oscillators. This is in part because frequency increases or decreases are made with respect to a fixed frequency which has a precise value. This is also because the percentage frequency error of the variable frequency pulse trains apply only to the number of frequency control pulses and are, therefore, diluted by the ratio of the unijunction oscillator frequencies to the crystal oscillator frequency. In variable frequency oscillators where the entire output frequency variation is produced by an oscillator such as 19*a*, the percentage frequency error applies to the entire output frequency.

Another advantage of the circuit of the invention is that the variability of its output frequency can be suppressed when it is desired to produce a pulse train having a highly accurate frequency of predetermined fixed value. If, for example, pulse generator 10 operates at a frequency such that, in the absence of frequency control pulses on conductors 26*a* and 26*b*, the repetition rate of the pulse train at the output of frequency divider 12 is precisely 60 pulses per second, the circuit of FIG. 1 may be utilized in one of two ways. First, it maybbe utilized as a variable frequency pulse generator having an output frequency range from 0 pulses per second to 120 pulses per second. Second, it may be utilized as a fixed frequency oscillator to establish a 60 pulse per second frequency standard. Thus, the circuit of the invention is a dual mode oscillator circuit.

In the present embodiment, the variability of the output frequency of the circuit of FIG. 1 is suppressed by forcing flip-flops 28 and 34 to assume and hold their inactive or reset states. This is accomplished by applying a continuous low to the R inputs of flip-flops 28 and 34, as for example, by applying ground potential to the mode control inputs $\mathbf{13a_4}$ and $\mathbf{13b_4}$ of adder 13*a* and subtractor 13*b* through mode selector switches S1 and S2.

Figure 2D:
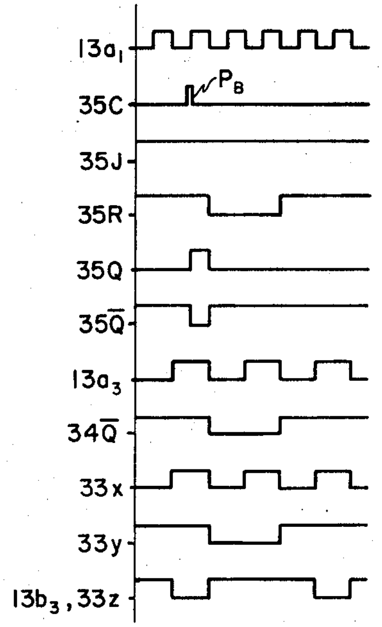

While the presence of an added pulse, as shown in FIG. 2*b*, or the absence of an eliminated pulse, as shown in FIG. 2*d*, is manifested as a transient frequency change at the output $\mathbf{13b_3}$ of the pulse subtractor, this frequency change does not detrimentally affect the operation of load 11. This is because the frequency dividing activity of frequency divider 12 evens out the periods of the different pulses so that the effect of transient frequency variations at the load are greatly reduced.

Figure 3:
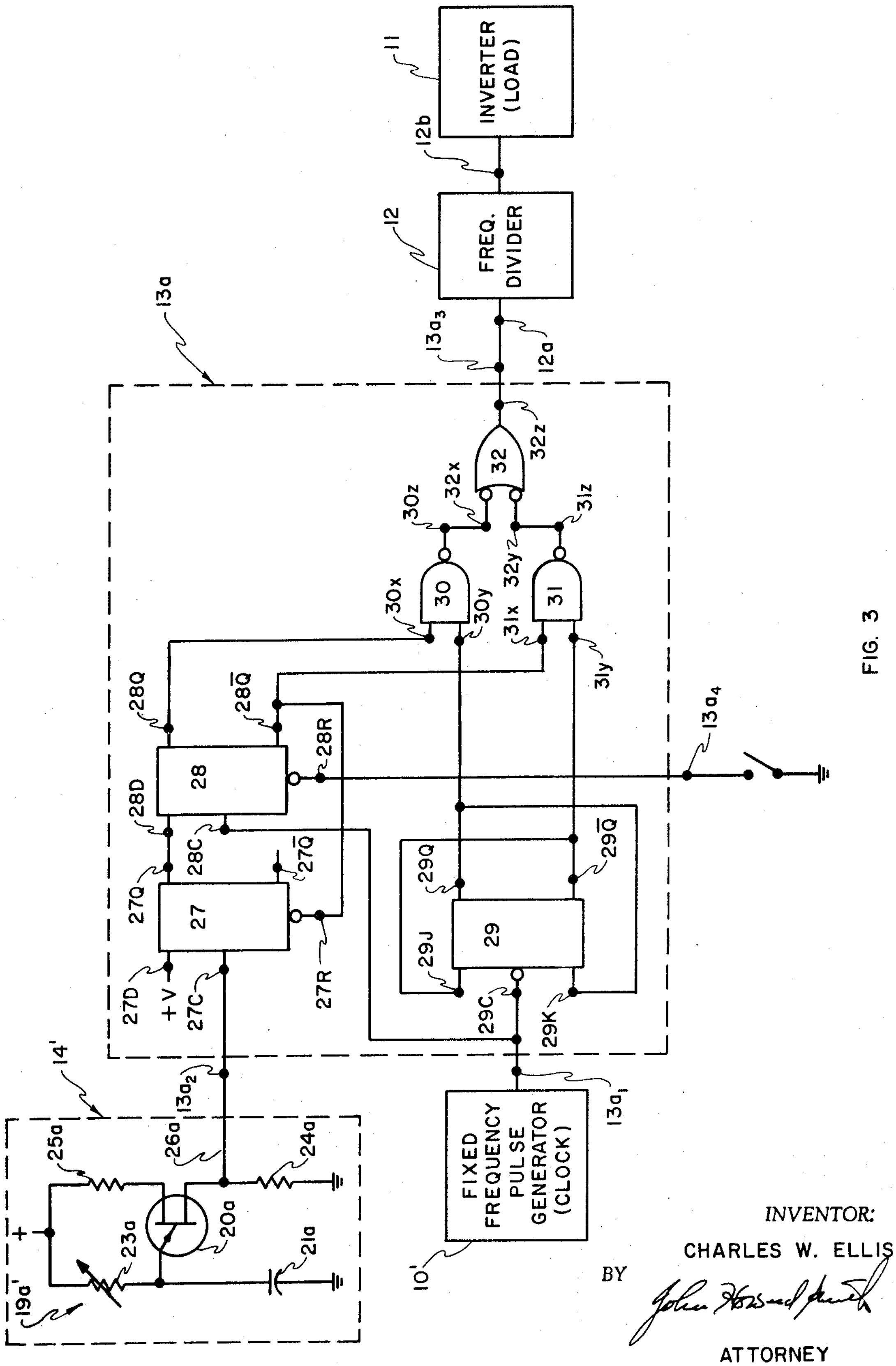
FIG. 3 is a combined schematic and logic diagram showing another circuit embodying the invention and FIG. 4 is a combined schematic and block diagram showing still another circuit embodying the invention.

If it is unnecessary for generator 10 to establish an output pulse train having an output frequency which varies in both directions from the frequency established by generator 10, the desired variable frequency pulses may be generated by a circuit of the type shown in FIG. 3. The circuit of FIG. 3 is similar to the circuit of FIG. 1 and like parts are similarly numbered.

Referring to FIG. 3, it will be seen that the pulse subtractor network described in connection with FIG. 1 has been eliminated. Also eliminated is the oscillator which controlled the latter network. This is possible because the desired range of frequency variation can be provided by utilizing a crystal oscillator 10′ having a lower frequency than oscillator 10 of FIG. 1 and by varying the number of pulses added by pulse adder 13*a*. Thus, the circuit of FIG. 3 differs from that of FIG. 1 in that the lower frequency limit of the former circuit is equal to the frequency established by its generator 10′ while the lower frequency limit of the latter circuit is beneath the frequency established by its generator 10. It will be understood that the desired frequency variations can be also produced by providing a circuit in which the pulse adder rather than the pulse subtractor is eliminated.

Under the circumstances where it is necessary to control the frequency of the signal generating circuit of the invention in accordance with an external reference such as the commercial a-c line, automatic rather than manual frequency control is desirable. This automatic control may be exercised by any suitable feedback control circuit if the variable frequency pulse generator is modified so as to render it subject to such control.

Figure 4:
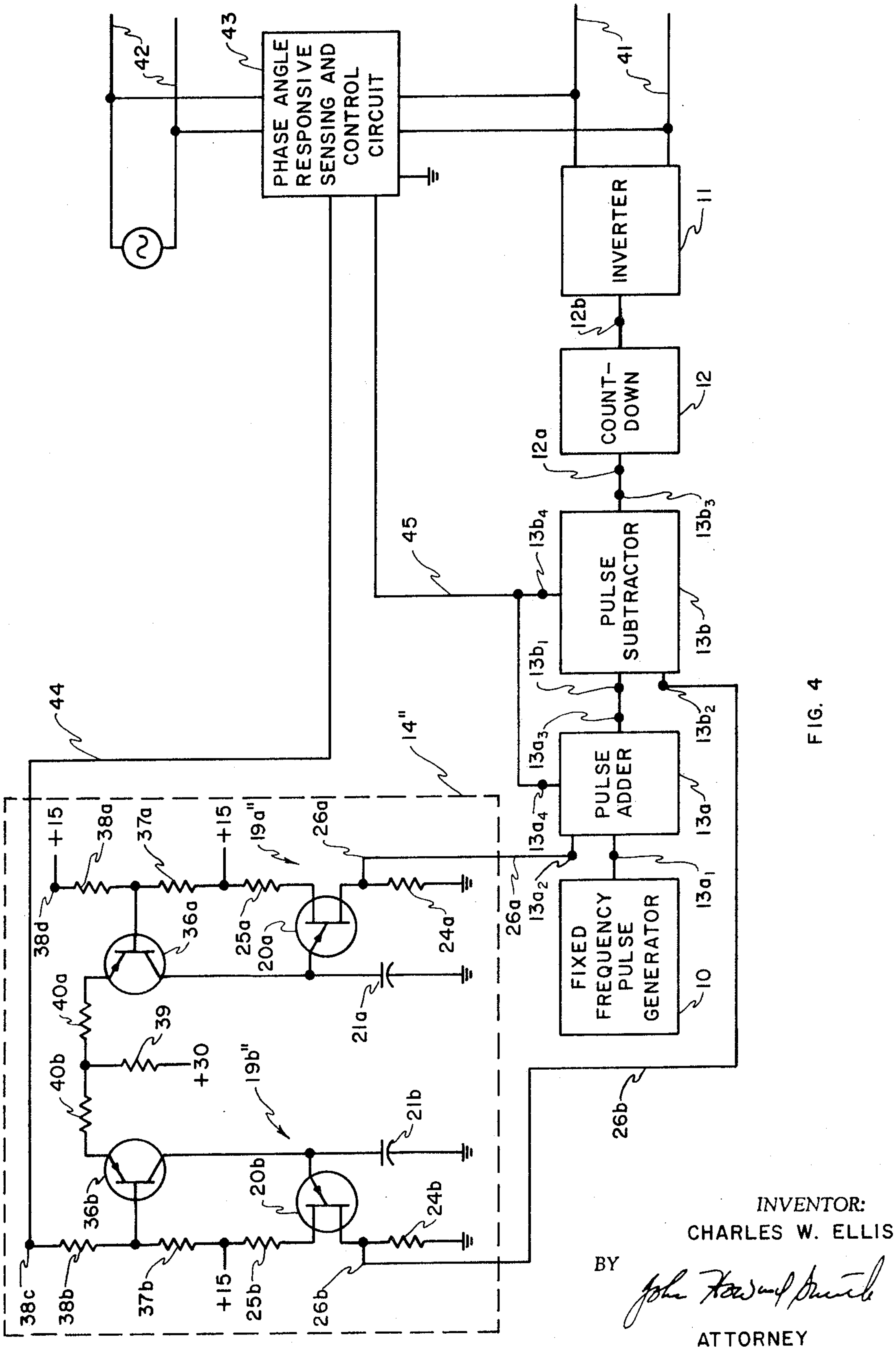

FIG. 4 shows one variable frequency pulse generator 14″ which is subject to automatic control. The pulse generator 14″ includes a plurality of circuit elements which have been described previously in connection with the circuits of FIGS. 1 and 3. In addition, this pulse generator is provided with a frequency control network including transistors 36*a* and 36*b*, biasing resistors 37*a* and 38*a* and 37*b* and 38*b*, current limiting resistor 39 and emitter resistors 40*a* and 40*b*. In effect the circuit of FIG. 4 utilizing the instant invention may serve various uses such as, for example, to synchronize the voltage of a d-c to a-c converter with the voltage of commercial a-c line. A sensing network senses the commercial line frequency and impresses that sensed frequency on the inverter source for the purpose of synchronization of the two sources.

Assuming, for example, that the a-c voltage appearing on output conductor pair 41 of inverter 11 is to be kept in synchronism with the voltage on a-c line 42, a phase angle responsive sensing and control circuit 43 may be provided which will control the magnitude of the frequency control signal that is applied to the pulse generating oscillator 14″ through a conductor 44. A particularly advantageous sensing and control circuit is shown and described in the above-named copending application. Consequently, the sensing and control circuit of FIG. 4 is shown in block form only.

When the voltage between ground and conductor 44 is at an exemplary quiescent value of +15 volts d-c, due, for example, to the fact that the inverter and the line have the same frequency, substantially equal emitter-base currents will flow through transistors 36*a* and 36*b*. This is because, under the assumed condition, the emitters of the above transistors, as shown in FIG. 4, are connected to an exemplary +30 volt d-c supply such as a battery or a converter through a substantially equal resistances 40*a* and 40*b* and also because the bases of the above transistors are connected to a +15 volt supply through substantially equal resistances 37*a* and 37*b* and to junctions 38*c* and 38*d* (both of which are at +15 volts from ground, under the assumed condition) through substantially equal resistances 38*a* and 38*b*.

Under the above conditions, transistors 36*a* and 36*b* will conduct substantially equal emitter-collector currents from the +30 volt supply to ground through capacitors 21*a* and 21*b*, respectively. This causes unijunction oscillators 19*a″* and 19*b″* to produce output pulse trains of substantially equal frequency. As a result, the frequency increasing effect of pulse adder 13*a* will be substantially cancelled by the frequency reducing effect of pulse subtractor 13*b* and the frequency of inverter 11 will be maintained at its predetermined fixed value, that is, the value which is determined by pulse generator 10.

When, however, the potential of conductor 44 rises or falls from its quiescent value of +15 volts, due to the fact that the inverter and the line have different frequencies, unequal emitter-base currents will flow in transistors 36*a* and 36*b*. This is because the base of transistor 36*a* will still be connected, through resistor 38*a*, to point 38*d* which is at a potential of +15 volts while the base of transistor 36*b* will be connected, through resistor 38*b*, to point 38*c* which is at a potential different from +15 volts. Since this condition will cause transistors 36*a* and 36*b* to conduct different emitter-collector currents, it will be seen that the frequencies of the pulse trains from oscillators 19*a*'' and 19*b*'' will differ, thereby causing the effect of either the pulse adder or the pulse subtractor to predominate. The latter condition, in turn, causes the inverter output voltage frequency to change so as to follow changes in the condition of the a-c line. Thus, the frequency of the signal generating circuit of the invention may be controlled in accordance with an external reference of variable frequency.

In the present embodiment variable frequency pulse generator 14'' is of the differentially responsive type. As a result, as the frequency of the output pulse train from one oscillator increases, the frequency of the other output pulse train from the other oscillator decreases. In the circuit of FIG. 4, this characteristic results from the presence of resistor 39 since the latter is in series with the emitter-base and emitter-collector circuits of both transistors so that an increase in the emitter-collector circuit of one transistor reduces the emitter-base current of the other transistor.

As described previously, with reference to FIGS. 1 and 3, the application of a suppress signal to either the pulse adder network, or the pulse subtractor network or both of FIG. 4 will suppress the frequency modifying activity of the respective network or networks. Under these circumstances, the inverter will run at its nominal or center frequency under the control of fixed frequency pulse generator 10. This capability of operation independent of generator 14'' as well as operation dependent on that generator is of great importance under circumstances where the a-c line fails or otherwise becomes unsuitable for use as an external reference. Under the above circumstances,ccontinued inverter operation can be achieved by initiating the required suppress signals. This may be accomplished manually by means of switches S1 and S2 of FIG. 1, or may be accomplished automatically by means of a suppress signal applied to a conductor 45 by sensing and control circuit 43 of FIG. 4. One circuit suitable for automatically generating the required suppress signal is shown and described in the above-named copending application.

From the foregoing, it will be seen that a pulse generating circuit constructed in accordance with the invention is adapted to generate a highly stable, variable frequency pulse train when the circuit operates in a first mode and is adapted to generate a highly stable fixed frequency pulse train when the circuit operates in a second mode. It will further be seen that this result is accomplished in an improved manner by increasing or decreasing the number of transitions which are initiated by a fixed frequency pulse generator.

It will be understood that the embodiments shown herein are for explanatory purposes only and may be changed or modified without departing from the spirit and scope of the appended claims.

What is claimed is:

1. In a circuit for generating a two-state pulse train in which the number of transitions between the two states per unit of time is variable, in combination, a pulse output, fixed frequency pulse generating means for generating two-state pulses having a fixed number of transitions per unit of time at said pulse output, pulse adding means for increasing the number of transitions at said pulse output above said fixed number, pulse subtracting means for decreasing the number of transitions at said pulse output below said fixed number, variable frequency pulse generating means for generating a plurality of trains of frequency control pulses adapted to respectively control the number of transitions added and subtracted by said adding and subtracting means, said pulse adding means having first and second input means and output means, means for connecting said fixed frequency pulse generating means to the first input means of said pulse adding means, means for connecting said variable frequency pulse generating means to the second input means of said pulse adding means to provide one train of frequency control pulses, said pulse subtracting means having first and second input means and output means, means for connecting the output means of said pulse adding means to the first input means of said pulse subtracting means, means for connecting said variable frequency pulse generating means to the second input means of said pulse subtracting means to provide another train of frequency control pulses, and means for connecting the output means of said pulse subtracting means to said pulse output.

2. A circuit as set forth in claim 1 including mode control means for suppressing the transition increasing and decreasing activity of said pulse adding and pulse subtracting means and means for connecting said mode control means to said pulse adding means and pulse subtracting means.

3. A circuit as set forth in claim 1 in which said variable frequency pulse generating means includes first and second pulse generators, means for differentially varying the operative frequencies of said first and second pulse generators and means for connecting said last-named means to said first and second pulse generators.

4. In a circuit for generating a two-state pulse train in which the number of transitions between the two states per unit of time may be increased with respect to a fixed number of transitions per unit of time, in combination, fixed frequency pulse generating means for generating two-state clock pulses having a fixed number of transitions per unit time, variable frequency pulse generating means for generating two-state frequency control pulses having a variable number of transitions per unit time, circuit output means, comparing means having a plurality of inputs and an output, said comparing means serving to establish a first state at the output thereof when the inputs thereof are in like states and to establish a second state at the output thereof when the inputs thereof are in unlike states, first switching means for energizing predetermined inputs of said comparing means in accordance with said clock pulses, second switching means for energizing predetermined other inputs of said comparing means in accordance with said frequency control pulses, means for connecting said first and second switching means to the inputs of said comparing means, said second switching means including storing means for storing the fact of the occurrence of each frequency control pulse and releasing means for changing the state of said predetermined other inputs in accordance with each such stored fact upon predetermined transitions of respective next occurring clock pulses, means for connecting said first switching means to said fixed frequency pulse generating means, and means for connecting said second switching means to said fixed and variable frequency pulse generating means.

5. In a circuit for generating a two-state pulse train in which the number of transitions between the two states per unit of time may be decreased with respect to a fixed number of transitions per unit of time, in combination, fixed frequency pulse generating means for generating two-state clock pulses having a fixed number of transitions per unit time, variable frequency pulse generating means for generating two-state frequency control pulses having a variable number of transitions per unit time, circuit output means, mixing means having input means and output means, said mixing means serving as means for controlling the state of said circuit output means in accordance with said clock pulses and in accordance with said frequency control pulses, first switching means for energizing predetermined input means of said mixing means in accordance with said clock pulses, second switching means for energizing predetermined other input means of said mixing means in accordance with said frequency control pulses, means for connecting said first and second switching means to the input means of said mixing means, said second switching means including storing means for storing the fact of the occurrence of each frequency control pulse and releasing means for changing the state of said other input means in accordance with each such stored fact upon a predetermined respective transition of the first switching means, means for connecting said first switching means to said fixed frequency pulse generating means, and means for connecting said second switching means to said variable frequency pulse generating means and to said first switching means.

* * * * *